United States Patent [19]

Grangereau

[11] Patent Number: 4,571,568
[45] Date of Patent: Feb. 18, 1986

[54] DEVICE FOR MAINTAINING AND FIXING COILS PROVIDED FOR MAKING A CONSTANT AND HOMOGENEOUS MAGNETIC FIELD

[75] Inventor: Jean A. M. Grangereau, Orsay, France

[73] Assignee: Drusch et Cie, Rueil-Malmaison, France

[21] Appl. No.: 581,343

[22] Filed: Feb. 17, 1984

[30] Foreign Application Priority Data

Feb. 21, 1983 [FR] France ............................... 83 02757

[51] Int. Cl.⁴ .............................................. H01F 5/00
[52] U.S. Cl. ..................................... 335/299; 324/320
[58] Field of Search ....................... 335/216, 299, 300; 324/318, 319, 320; 128/653

[56] References Cited

U.S. PATENT DOCUMENTS 4,284,950  8/1981  Burl et al. ............................ 324/320

*Primary Examiner*—Harold Broome
*Attorney, Agent, or Firm*—Browdy & Neimark

[57] ABSTRACT

A device for fixing and maintaining coils contained within armatures to provide a constant and homogeneous magnetic field. The device includes an amagnetic bench having a longitudinal axis, a frame having two upstanding panels mounted on the bench, a first reference armature secured by the panels, at least two additional armatures for support longitudinally along the bench, each of the additional armatures being of a diameter less than or equal to that of the first armature, and mounting apparatus for supporting the additional armatures at locations on the bench spaced from the first armature, whereby the additional armatures may be placed, relative to one another and to the first armature on the periphery of an imaginary sphere. The mounting apparatus includes adjustment apparatus for adjusting the additional armatures relative to the first armature in longitudinal and vertical directions. Additional adjustment members may be disposed between adjacent armatures to maintain the additional armatures in spaced, vertical dispositions relative to the first armature, and cooling ducts may be provided in each of the armatures to permit the flow therethrough of a cooling liquid.

5 Claims, 4 Drawing Figures

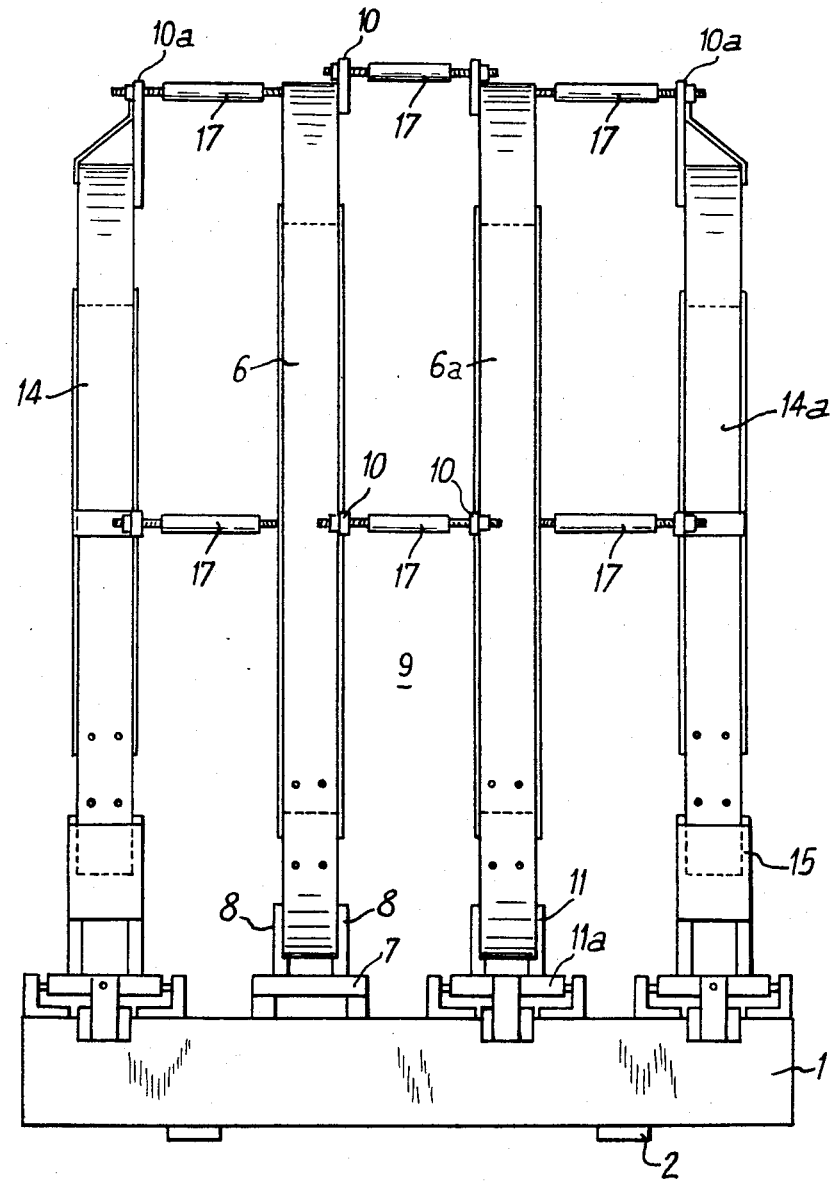

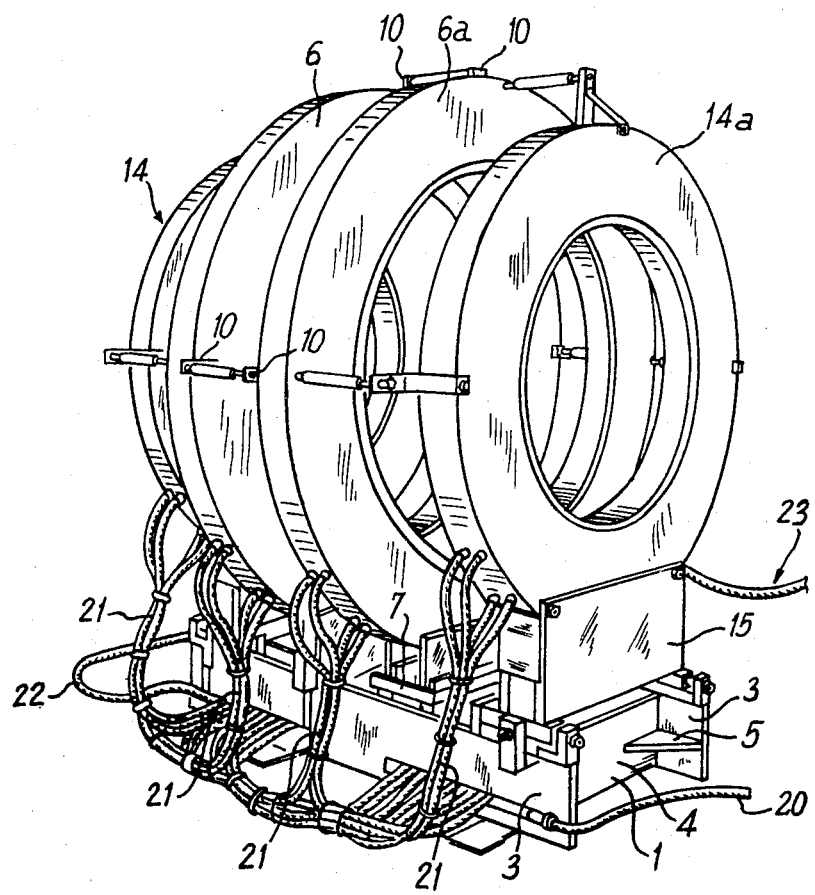

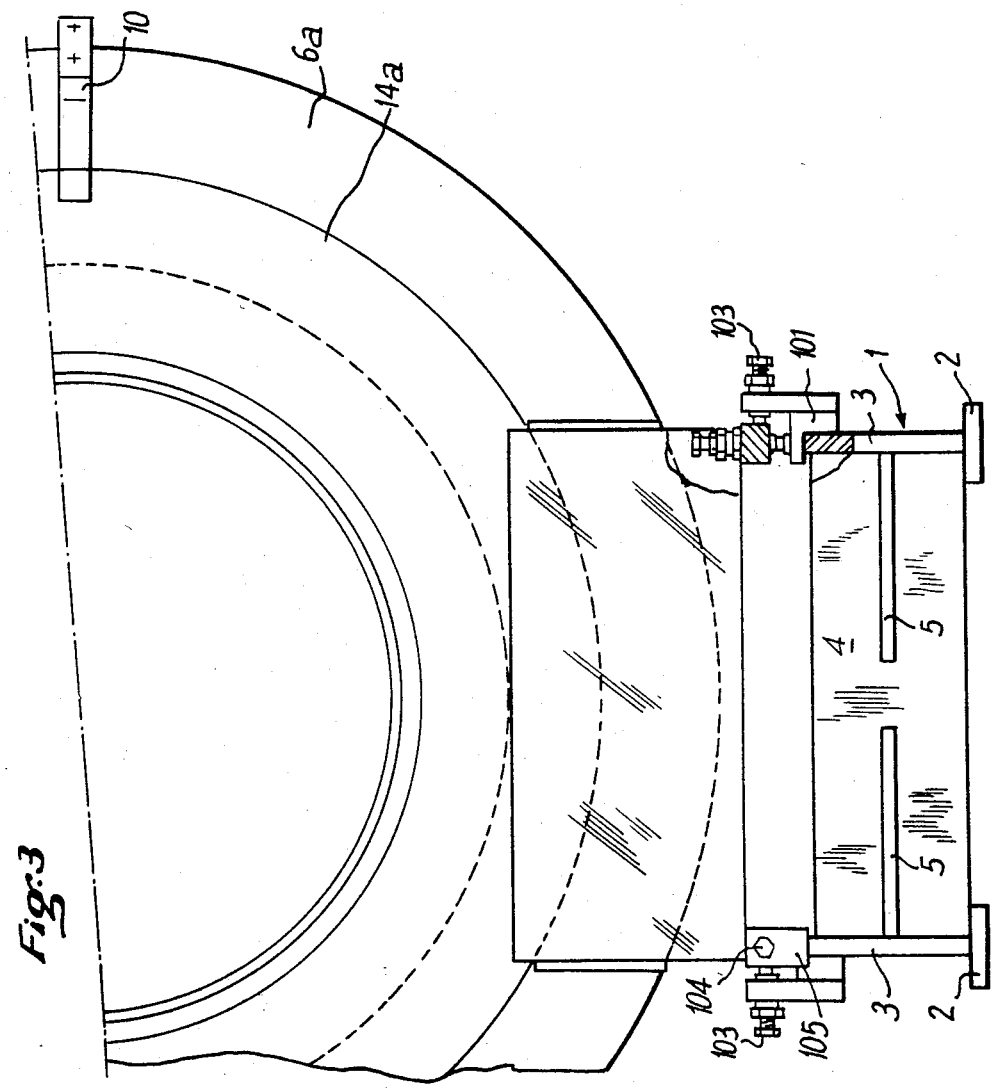
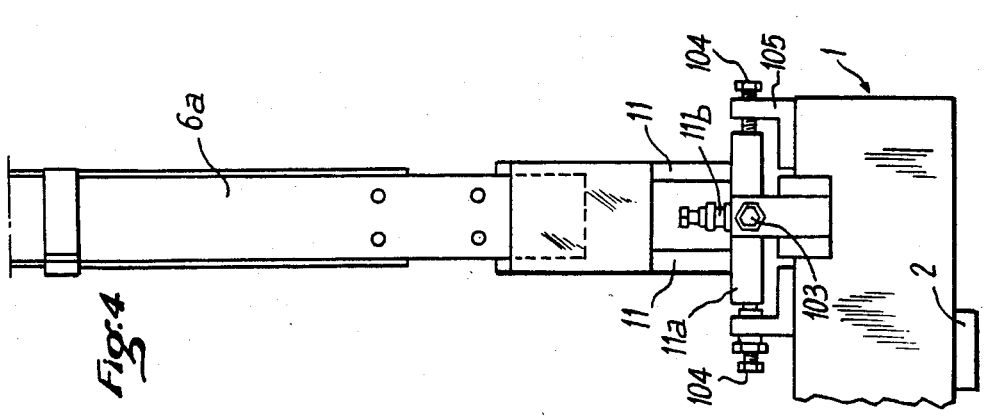

DEVICE FOR MAINTAINING AND FIXING COILS PROVIDED FOR MAKING A CONSTANT AND HOMOGENEOUS MAGNETIC FIELD

FIELD OF THE INVENTION

It is known that it is absolutely necessary to make an homogeneous magnetic field for obtaining correct images in a nuclear magnetic resonance imaging (NMR imaging). In order to obtain an homogeneous magnetic field, a first possibility is to wind a copper wire on a sphere and to cause an electric current to pass through this wire. There is thus obtained a magnetic field which is perfectly homogeneous in the center of the sphere but no access to the center is possible from the outside. It is therefore not possible to use a sphere for obtaining an homogeneous magnetic field in the case of a NMR imaging.

BACKGROUND OF THE INVENTION

When it is desired to have access from the outside in a volume of an homogeneous magnetic field, it is provided to make a system comprising a minimum of four coils, the arrangement of the windings of which is assumed to be substantially on an imaginary approximative sphere. There is thus formed, in the center of the volume limited by the four coils, a magnetic field which is substantially homogeneous. A construction is therefore made which is very interesting both with respect to the number of necessary amperes/turns and easiness for adjusting the coils.

Theorically inscribing the coils on a periphery of an imaginary approximative sphere seems to be simple but for obtaining this result on a great volume, it is extremely difficult to place the coils and then to maintain the coils, since the coils have a tendancy to expand because of the passage of the current, and react the one on the other. Thus, the coils have a tendancy to move the one with respect to the other, which is disadvantageous. Furthermore, it is necessary to take into account the environment which may contain interference magnetic fields, magnetic fields created by the iron body of a reinforced concrete building, a passage of one or a plurality of power supply cables, a more or less far positioning of various magnetic masses.

OBJECTS AND SUMMARY OF THE INVENTION

The present invention has therefore for its object to create a support for maintaining and fixing coils containing the windings in order to inscribe them substantially on an imaginary approximative sphere while providing an important central passage and to prevent any relative displacement of each coil the one with respect to the other in order to create an homogeneous and constant magnetic field.

According to the invention, the device for maintaining and fixing coils provided for making a constant and homogeneous magnetic field comprises a lower amagnetic body forming a bench on which is mounted a frame comprising two panels firmly maintaining an armature containing an electrical element used as a reference electric coil and mounted within the armature which also encloses ducts for a circulation of cooling liquid, then second frames suitably placed and supported by their lower parts on the body enable to place coils, directly or through boxes, the coils being contained in armatures of a diameter equal to that of the first named armature or smaller than that of the first named armature in order that electric windings of the coils are placed in such a manner that they are inscribed on periphery of an imaginary approximative sphere, adjustment of the windings being made through the armature by means of screw jacks placed between the bench and the lower part of the armature, and screw jacks placed between side irons or end irons fixed with the armatures and regularly mounted on periphery of the armatures by taking as reference the armature of the reference coil fixed on the frame.

According to another feature of the invention, the screw jacks are differential pitch maintaining means for enabling a fine adjustment of the position of the armatures the one with respect to the other in order to inscribe the windings contained within the armatures on the periphery of the imaginary approximative sphere.

According to still another feature of the invention, the armature and the electric winding are fixed by moulding and the side irons or end irons are fixed on the armature, while being either diametrically opposed the one with respect to the other or regularly mounted on the periphery of each armature.

Various other features of the invention will be moreover revealed from the following detailed disclosure.

BRIEF DESCRIPTION OF THE DRAWINGS

An embodiment of the device according to the invention is shown as a non-limitative example, in the accompanying drawings, wherein:

FIG. 1 is a side elevation view of a supporting device for four armatures containing the coils.

FIG. 2 is a general perspective view of the device of the invention.

FIGS. 3 and 4 are respectively enlarged front and side elevation views of means for maintaining and adjusting the armatures containing the coils.

DETAILED DESCRIPTION OF THE INVENTION

Referring now to the drawings, FIG. 1 shows a lower body forming a bench 1 supported on the ground by means of feet 2. As shown in FIG. 2, the bench 1 is made by side girders 3 suitably braced by means of cross-members 4, the cross-members 4 being themselves vertically maintained by suitably disposed square members 5. Obviously, the bench 1 is made of a non-deformable amagnetic material and carries at its upper part, in vicinity of its central area, a frame 7 comprising two vertical panels 8 on which is mounted an armature 6 containing an electric member hereinafter called the reference coil 9. The armature 6 encloses a plurality of channels for a circulation of a cooling liquid, typically water. On the armature 6, side irons 10 are fixed, the side irons 10 being placed at 90° the one with respect to the other around the armature 6, but the side irons can be regularly placed around the armature with other angles than 90°.

Another armature 6a of a great size (see FIGS. 3 and 4) is exactly made as the armature 6. The armature 6a is supported on the body 1 by means of two panels 11 connected at their lower part by two cross-members 11a carried through differentially threaded vertical jacks 11b on two supports 101 of a substantially T-shape and which are fixed to the bench 1, then by two transverse differential jacks 103 carried by parts 101 and by four longitudinal differential jacks 104 carried by four square members 105 fixed on top of the bench 1. It is therefore easy to adjust the position of the armature 6a by means of the vertical jacks 11b and horizontal jacks 103, 104.

End armatures 14 and 14a (FIGS. 1 and 2) have a diameter smaller than the armatures 6 and 6a and are supported on the body 1 by means of a box 15, the position of which is adjusted by a set of vertical and horizontal ajusting jacks similar to that above described for the armature 6a. Moreover, in the present embodiment, at three different places, side irons 10 or end irons 10a are fixed on the armatures 6, 6a, 14 and 14a, the lateral irons 10 and the end irons 10a enabling to position screw jacks 17 which are differential pitch maintaining means.

When the whole unit is positioned, the armature 6 of the reference coil 9 being perfectly vertically and safely fixed with respect to the bench 1, and the armatures 6a, 14 and 14a being geometrically placed as well as possible with respect to the armature 6, there is determined by means of very precise magnetic measurements the various adjustments to be done on the positions of the armatures 6a, 14 and 14a, and the adjustments are made by means of the jacks 11b, 103, 104 and 17, with a great accuracy in order to obtain the desired homogeneous magnetic field.

In the present case, the armatures 6, 6a, 14 and 14a are maintained in five points, but it is also possible to maintain the armatures in three, four, six points or more by placing another number of elements similar to the jacks 17.

However, the arrangement of the four parallel armatures (see FIGS. 1 and 2) of different inner and outer diameters enables to inscribe rather easily the corresponding windings on the surface of a substantially spherical volume.

FIG. 2 shows from a feeding duct 20, the various ducts 21 feeding with cooling water the plurality of channels placed within the armatures 6, 6a, 14 and 14a. The cooling water comes-out by a duct 22. Reference 23 shows a cable for the power supply of the coils.

Although the four-coil arrangement as hereinbefore described enables to obtain a very homogeneous magnetic field, it is possible in some cases to place more than four coils in order to increase homogeneity of the magnetic field. In this case, from the reference coil which is the coil 9 in the present embodiment, the position of the various coils is adjusted by means of the maintaining screw jacks with a differential pitch, referenced 17, as above explained.

As it had been already stated, the body or bench 1 is made of a non deformable amagnetic material and it is able to support the weight of four armatures 6, 6a, 14, 14a of the coils as well as the strains of magnetic origin which are exerted between the coils because of their mutual action.

The bench 1 also supports size variations due to variations of ambiant temperatures, but because of the spherical design of the connecting elements between the various armatures, the various distorting facts act only with a second order.

This enables to be sure that the magnetic field within the coils is altered only at the second degree by these various distorting facts, without risking to cause perturbations upon NMR imaging.

Preferably, the armature and the electric winding are fixed by moulding.

What is claimed is:

1. A device for fixing and maintaining coils contained within armatures for making a constant and homogeneous magnetic field, said device comprising:
    an amagnetic bench having a longitudinal axis,
    a first frame mounted on said bench, said frame comprising two upstanding panels,
    a first armature firmly secured by said panels, said armature containing an electrical element used as a reference electric coil, said electrical element being mounted within said first armature,
    at least two additional armatures for support longitudinally along, and by, said bench, each of said additional armatures having a diameter less than or equal to that of said first armature,
    means, supported at locations on said bench spaced from said first frame, for mounting said additional armatures so that they may be placed, relative to one another and said first armature, on the periphery or an imaginary sphere, said mounting means including means for adjusting said additional armatures relative to said first armature in longitudinal and vertical directions, and
    threaded adjustment means, disposed between and interconnecting adjacent armatures, for maintaining said additional armatures in spaced, vertical dispositions relative to said first armature.

2. The device of claim 1, and further including duct means, coupled to each of said armatures, for circulating a cooling liquid therethrough.

3. The device as set forth in claim 1, wherein said adjusting means and said threaded adjustment means comprise screw jacks, said screw jacks defining differential pitch maintaining means for enabling a fine adjustment of the position of the armatures relative to one another in order to inscribe the windings of the coils contained within said armatures on the periphery of the imaginery sphere.

4. The as set forth in claim 1, wherein said threaded adjustment means include irons secured to, and peripherally about, said armatures, the irons being diametrically opposed with respect to each other.

5. The device as set forth in claim 1, wherein said threaded adjustment means include irons secured to, and peripherally about, said armatures, the irons being regularly mounted on the periphery of each armature.

* * * * *